United States Patent
Liu et al.

(10) Patent No.: US 10,231,333 B1
(45) Date of Patent: Mar. 12, 2019

(54) COPPER INTERCONNECT FOR PTH COMPONENTS ASSEMBLY

(71) Applicant: Flextronics AP, LLC, Broomfield, CO (US)

(72) Inventors: Weifeng Liu, Dublin, CA (US); Zhen Feng, San Jose, CA (US); Anwar Mohammed, San Jose, CA (US); David Geiger, Dublin, CA (US); Murad Kurwa, San Jose, CA (US)

(73) Assignee: Flextronics AP, LLC., Broomfield, CO (US)

( * ) Notice: Subject to any disclaimer, the term of this patent is extended or adjusted under 35 U.S.C. 154(b) by 68 days.

(21) Appl. No.: 14/307,201

(22) Filed: Jun. 17, 2014

Related U.S. Application Data

(60) Provisional application No. 61/870,646, filed on Aug. 27, 2013.

(51) Int. Cl.
| | |
|---|---|
| *H05K 1/09* | (2006.01) |
| *H05K 3/42* | (2006.01) |
| *H05K 1/11* | (2006.01) |

(52) U.S. Cl.
CPC ............. *H05K 1/097* (2013.01); *H05K 1/115* (2013.01); *H05K 3/428* (2013.01)

(58) Field of Classification Search
USPC .................................. 361/772; 174/257, 264
See application file for complete search history.

(56) References Cited

U.S. PATENT DOCUMENTS

| | | |
|---|---|---|
| 4,733,383 A | 3/1988 | Waterbury |
| 4,956,524 A | 9/1990 | Karkow |
| 5,085,922 A | 2/1992 | Murasawa |
| 5,777,275 A | 7/1998 | Mizutani et al. |
| 5,816,848 A | 10/1998 | Zimmerman |
| 6,349,201 B1 | 2/2002 | Ford |
| 6,534,723 B1 | 3/2003 | Asai |
| 6,714,431 B2 | 3/2004 | Gamini et al. |
| 6,743,982 B2 | 6/2004 | Biegelsen |
| 7,041,357 B2 | 5/2006 | Hsieh |
| 7,319,895 B2 | 1/2008 | Klefstad-Sillonville |
| 7,456,571 B1 | 11/2008 | Wedding |
| 7,491,892 B2 | 2/2009 | Wagner |
| 7,629,691 B2 | 12/2009 | Roush |
| 7,786,389 B2 | 8/2010 | Tsukada |
| 7,795,540 B2 | 9/2010 | Yamada |
| 8,157,730 B2 | 4/2012 | LeBoeuf |
| 8,207,473 B2 | 6/2012 | Axisa |
| 8,467,726 B2 | 6/2013 | Shirakata |
| 9,018,532 B2 | 4/2015 | Wesselmann |
| 2003/0093248 A1 | 5/2003 | Vock |

(Continued)

OTHER PUBLICATIONS

Notice of Allowance dated Apr. 5, 2017, U.S. Appl. No. 14/712,842, filed May 14, 2015, applicant.: Joan K. Vrtis, 19 pages.

(Continued)

*Primary Examiner* — Andargie M Aychillhum
(74) *Attorney, Agent, or Firm* — Haverstock & Owens LLP

(57) ABSTRACT

Methods of making a copper interconnect plated through hole assembly are disclosed. Nano copper ink dispersed in an organic solvent is able to be filled in the plated through hole and forming the copper interconnect by sintering at a temperature below the melting of the copper.

13 Claims, 5 Drawing Sheets

(56) References Cited

U.S. PATENT DOCUMENTS

| | | | |
|---|---|---|---|
| 2004/0082189 A1* | 4/2004 | Totokawa | H05K 3/125 |
| | | | 438/720 |
| 2004/0111045 A1 | 6/2004 | Sullivan | |
| 2004/0259391 A1 | 12/2004 | Jung et al. | |
| 2004/0262036 A1 | 12/2004 | Brist | |
| 2005/0154264 A1 | 7/2005 | Lecompte et al. | |
| 2005/0237725 A1 | 10/2005 | Cho | |
| 2006/0000633 A1 | 1/2006 | Hopper | |
| 2006/0035554 A1 | 2/2006 | Glaser et al. | |
| 2006/0046471 A1* | 3/2006 | Kirby | H01L 21/76898 |
| | | | 438/638 |
| 2006/0072944 A1 | 4/2006 | Sharma | |
| 2006/0254811 A1 | 11/2006 | Tunde | |
| 2006/0282018 A1 | 12/2006 | Balzano | |
| 2007/0232455 A1 | 10/2007 | Hanoun | |
| 2008/0157235 A1 | 7/2008 | Rogers | |
| 2008/0182475 A1 | 7/2008 | Gnade | |
| 2008/0223844 A1 | 9/2008 | Cronn | |
| 2009/0102580 A1 | 4/2009 | Uchaykin | |
| 2009/0173529 A1 | 7/2009 | Lee | |
| 2009/0309739 A1 | 12/2009 | Ezer | |
| 2009/0315320 A1 | 12/2009 | Finn | |
| 2010/0090834 A1 | 4/2010 | Buchnick | |
| 2011/0063098 A1 | 3/2011 | Fischer | |
| 2011/0114376 A1 | 5/2011 | Shoji | |
| 2011/0245633 A1 | 10/2011 | Goldberg | |
| 2012/0052268 A1 | 3/2012 | Axisa | |
| 2012/0176764 A1 | 7/2012 | Loher | |
| 2013/0216065 A1 | 8/2013 | Nguyen | |
| 2013/0316551 A1* | 11/2013 | Day, Jr. | H05K 13/04 |
| | | | 439/84 |
| 2014/0124245 A1 | 5/2014 | Lai | |
| 2014/0190727 A1 | 7/2014 | Lee | |
| 2014/0275857 A1 | 9/2014 | Toth | |
| 2015/0015288 A1* | 1/2015 | Ma | G01R 1/06738 |
| | | | 324/754.03 |
| 2015/0041201 A1 | 2/2015 | Van Heck | |
| 2015/0109124 A1 | 4/2015 | He | |
| 2015/0245777 A1 | 9/2015 | Della Torre | |
| 2016/0020500 A1 | 1/2016 | Matsuda | |
| 2016/0034634 A9 | 2/2016 | Hong | |
| 2016/0183372 A1 | 6/2016 | Park | |
| 2017/0358841 A1 | 12/2017 | Chen | |
| 2018/0070446 A1 | 3/2018 | Takahashi | |

OTHER PUBLICATIONS

Non-Final Office Action dated May 17, 2018, U.S. Appl. No. 14/724,673, filed May 28, 2015, Applicant: Weifeng Liu, 19 pages.

* cited by examiner

COPPER INTERCONNECT FOR PTH COMPONENTS ASSEMBLY

CROSS-REFERENCE TO RELATED APPLICATION(S)

This application claims priority under 35 U.S.C. § 119(e) of the U.S. Provisional Patent Application Ser. No. 61/870,646, filed Aug. 27, 2013 and titled "STRETCHABLE METALS," which is hereby incorporated by reference in its entirety for all purposes.

FIELD OF THE INVENTION

The present invention relates to the field of semiconductor manufacturing. More specifically, the present invention relates to the filling of plated-through holes (PTH) on a printed circuit board (PCB).

BACKGROUND OF THE INVENTION

Wave soldering process for PTH components assembly is typically used in the semiconductor industry. The wave soldering process posses several drawbacks. For example, high temperatures (235° C. for tin lead, 245° C. for lead free process) that are required for using the wave soldering process can potentially damage the heat sensitive components. Further, full barrel formed without voids is difficult to achieve due to the heat sink effect of PCB and components (the temperature at the top side is much lower than the bottom side), especially for thicker boards (>3 mm) and large components with huge mass. Furthermore, the wave soldering process can cause copper pad erosion.

SUMMARY OF THE INVENTION

The constructions, materials, and methods of making interconnect for PTH components are disclosed. The present invention is advantageous in many aspects. For example, the constructions and methods disclosed herein have better joint reliability by forming copper interconnect and better barrel filling (such as higher than 75% and/or full filled barrel) by using a nano-ink compared with the wave soldering processes. Further, the presently disclosed materials and methods can use a lower temperature sintering (e.g., lower than 200° C.), such that damage to heat sensitive components are able to be avoided. Furthermore, the methods and materials disclosed herein can use copper instead of expensive metals (such as silver), which can be a more cost effective form of manufacturing. Using the processes and the material disclosed herein, copper pad erosion that occurs in the typical wave soldering process is able to be reduced or even eliminated.

In an aspect, of the invention a method of forming a conductive interconnect comprises filling a solution into an aperture on an electronic board, wherein the solution contains conductive particles and a solvent and then removing the solvent. In some embodiments, the aperture comprises a plated through hole. In other embodiments, the electronic board comprises a printed circuit board. In some other embodiments, the conductive particles comprise copper. In some embodiments, the conductive particles comprise nanoparticles. In other embodiments, the nanoparticles comprise copper nanoparticles. In some other embodiments, the nanoparticles comprise nano copper ink. In some embodiments, the solvent comprises an organic solvent. In other embodiments, the method further comprises dispersing the conductive particles in the solvent. In some other embodiments, the method further comprises sintering. In some embodiments, the removing the solvent comprises heating at a predetermined temperature. In other embodiments, the predetermined temperature comprises a temperature below 201° C. In some other embodiments, the method further comprises inserting a pin.

In another aspect, a method of forming a conductive interconnect comprises filling a plated through hole with a conductive particles dispersed solution and forming a barrel filling on a printed circuit board. In some embodiments, the filling is performed by using an aerosol jet printer. In other embodiments, the filling is performed by using a surface mount technology (SMT) dispense machine. In some other embodiments, the conductive particles comprises nano copper ink. In some embodiments, the method further comprises heating at a temperature below 201° C. In other embodiments, the method further comprises removing a solvent of the solution. In some other embodiments, the method further comprises inserting a pin. In some embodiments, the pin comprises standoff. In other embodiments, the method further comprises sintering. In some other embodiments, the sintering is at a temperature below the melting temperature of the conductive particles.

In another aspect, an electronic apparatus comprises an aperture on an electronic board, wherein the aperture contains conductive particles and a solvent. In some embodiments, the aperture comprises a plated through hole. In other embodiments, the electronic board comprises a printed circuit board. In some other embodiments, the conductive particles comprise nanoparticles. In some embodiments, the nanoparticles are dispersed in the solvent. In other embodiments, the conductive particles comprise copper. In some other embodiments, the conductive particles comprise nano copper ink. In some embodiments, the apparatus further comprises a pin. In other embodiments, the pin blocks the bottom of the aperture forming a seal preventing the conductive particles from leaking out from the aperture.

Other features and advantages of the present invention will become apparent after reviewing the detailed description of the embodiments set forth below.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

DETAILED DESCRIPTION OF THE PREFERRED EMBODIMENT

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals are vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 1:
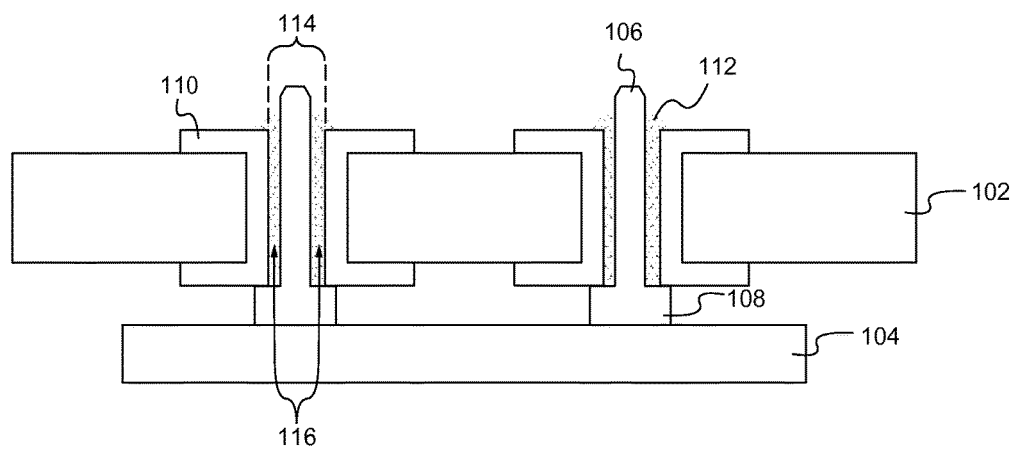
FIG. 1 illustrates a PTH construction in accordance with some embodiments of the present invention.

FIG. 1 illustrates a PTH construction 100 in accordance with some embodiments of the present invention. One or more PTH pins 106 are placed in the via through holes 114 of a PCB 102. The PTH pins 106 (T-shape in a upside down configuration) containing PTH pin standoffs 108 stand on a package 104 and block the via through holes 114, such that an amount of a nano conductive filing material 112 that are added from the top side of the via through holes 114 are retained and do not leak out from a filling area 116. The conductive filling material 112 is filled in the filling area 116 formed by a circular cylindrical shape of PTH barrel 110 and hermetically sealed by adjoining and pushing against the top side of the PTH pin standoff 108.

In some embodiments, the conductive filing material 112 comprises a nano conductive ink, such as a nano copper ink. In some embodiments, the particle size of the nano conductive ink is in the range of 1 nm to 50 nm. In other embodiments, the particle size of the nano conductive ink is in the range of 1 nm to 1000 nm. In some other embodiments, the particle size of the nano conductive ink is in the range of 5 nm to 15 nm.

In some embodiments, nano-copper ink (such as 10 nm) is dispersed in an organic solvent, such as hexane, dimethyl sulfoxide (DMSO), dimethyl either, dimethylformamide (DMF), methanol, or a combinational thereof. A person of ordinary skill in the art appreciate that any other organic solvents and/or inorganic solvents are applicable so long as the nano particles can be dispersed in the solvent.

In some embodiments, a component pin is inserted in the PTHs 114 (plated through holes) and the nano-copper ink/conductive filling material 112 that is dispersed in an organic solvent is dispensed in the PTHs 114 (plated through holes) by using a surface mount technology (SMT) dispense machine. The nano-copper ink/conductive filling material 112 is filled/flows into the PTH cavities (holes). In some embodiments, the SMT dispense machine includes a vacuum function to help draw the nano-copper ink/conductive filling material 112 fulfilling the PHT cavities.

In other embodiments, the nano-copper ink/conductive filling material 112 is dispensed into the PTHs 114 through an aerosol jet printer. The nano-copper ink/conductive filling material 112 flows into the PTHs after the insertion of the component pin (upside down) in the PTHs 114.

In some other embodiments, the nano-copper ink/conductive filling material 112 is deposited into the PTHs through the SMT dispense machine or the aerosol jet printer having a fixture at the bottom of the PTH to prevent the nano-copper ink/conductive filling material 112 from leaking or flowing out. Next, PTH pins are inserted into the holes.

In some embodiments, heat is applied to sinter the nano-copper ink/conductive filling material 112 to make connections between the pins and the PHT barrels. In some embodiments, the temperature for sintering is below 200° C., such as 195° C. During the process of sintering, the organic/inorganic solvent used to disperse the nano-copper ink/conductive filling material 112 is evaporated leaving the nano-copper ink/conductive filling material 112 filled the PTHs 114.

Figure 2:
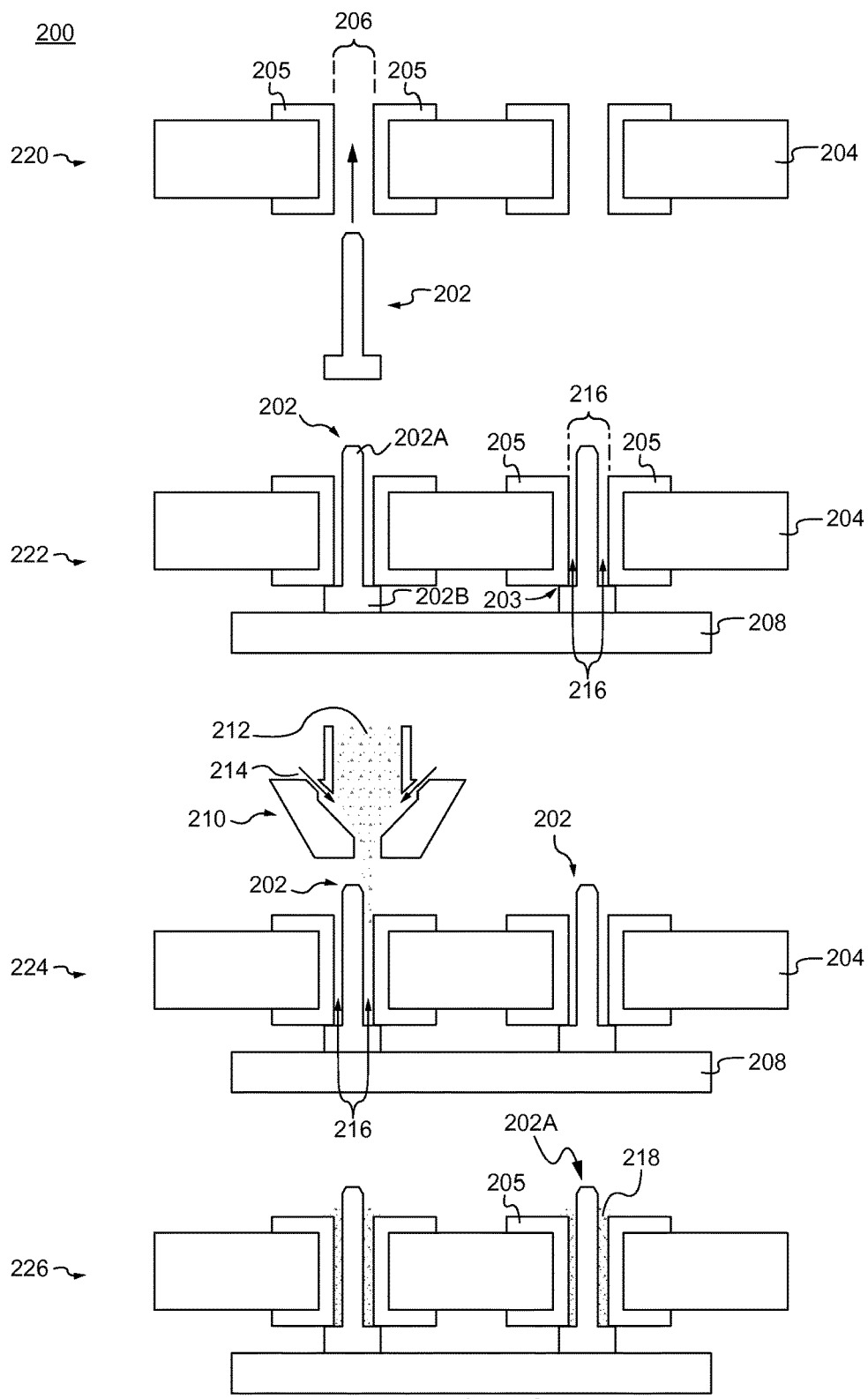
FIG. 2 illustrates a method of making a PTH component assembly in accordance with some embodiments of the present invention.

FIG. 2 illustrates a method of making a PTH component assembly 200 in accordance with some embodiments of the present invention. At a step 220, a PTH pin 202 is inserted into the PTH 206 from the bottom side of the PCB 204. In some embodiments, the PTH pin 202 includes a standoff 202B, which pushes against the PTH pads 203 to prevent the leakage of a conductive ink added to the gap 216. As shown in a step 222, the standoff 202B of the PTH pin 202 is pushed against the pad 203, which stands on the package 208. At a step 224, an amount of a conductive filling material 212, such as a nano copper ink, is deposited into the gap 216 between the head of the pin 202A and the barrel 205 of the PCB 204. In some embodiments, an aerosol jet printer 210 is used to deposit the conductive filling material 212. The aerosol jet printer 210 can contain a side channel allowing sheath gas 214 to facilitate dispensing the conductive filling material 212. The aerosol jet printer 210 can be in a distance of 2-5 mm from the top surface of the PCB 204 to the dispensing outlet. The speed of deposition can be controlled to prevent formation of bubbles trapped inside the gap, which is able to be configured by using computer executable instructions to command the operation of the aerosol jet printer 210. At step 226, a reflow profile is applied to sinter the conductive filling material 212. Solid connections 218 are made between the barrel 205 and the head of pin 202A after the evaporation of the solvent that is used to disperse the conductive filling material 212.

Figure 3:
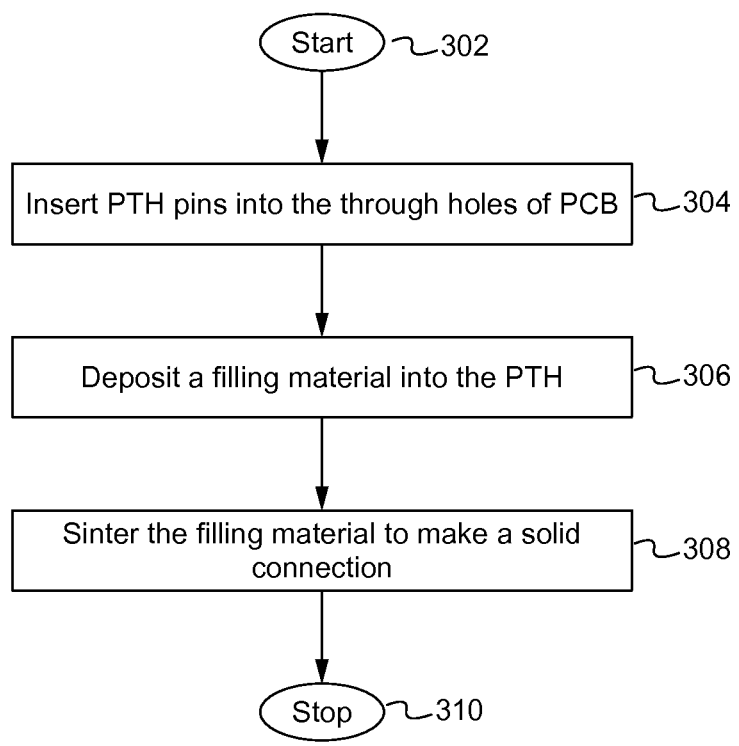
FIG. 3 is a flow chart illustrating a method of making a PTH assembly in accordance with some embodiments of the present invention.

FIG. 3 is a flow chart illustrating a method of making a PTH assembly 300 in accordance with some embodiments of the present invention. The method can start from a step 302. At step 304, one or more PTH pins are inserted into the plated through holes (PTHs) of the PCB. At step 306, a filling material is deposited into the PTHs. At step 308, the filling material is sintered to make solid connections. In some embodiments, the process 300 stops at step 310.

Figure 4:
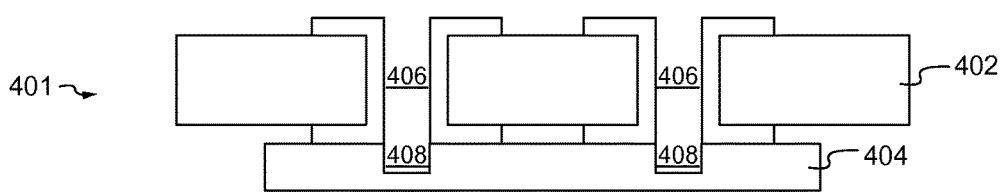
FIG. 4 illustrates a method of making a PTH component assembly in accordance with some embodiments of the present invention.
Figure 4:
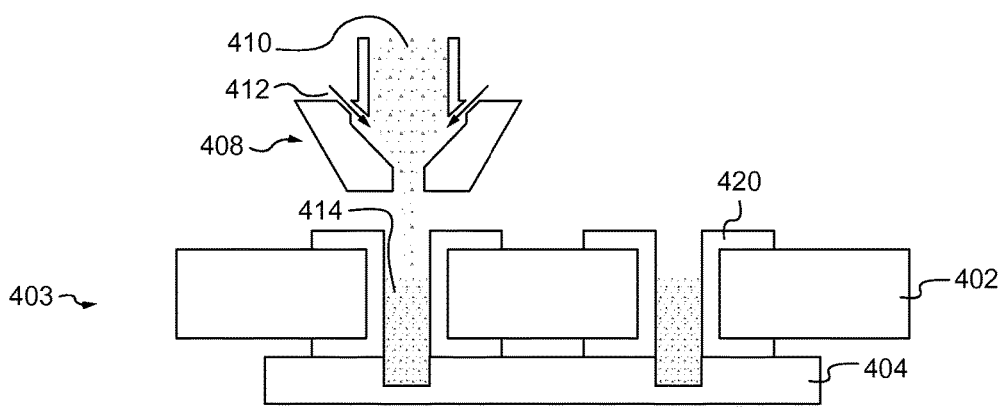
Figure 4:
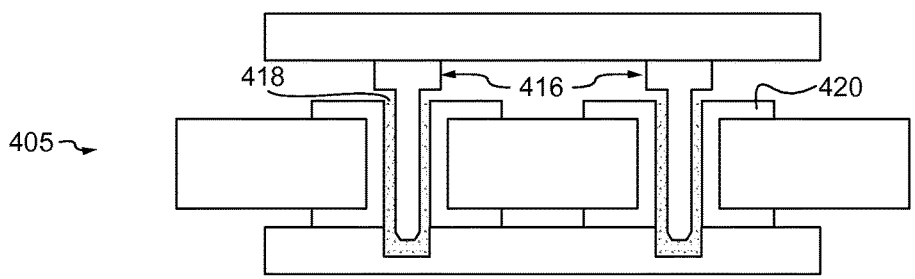

FIG. 4 illustrates a method of making a PTH component assembly 400 in accordance with some embodiments of the present invention. At a step 401, a fixture 404 is applied on the bottom of a PCB 402. The fixture can be used to prevent leaks of the a conductive ink. In some embodiments, the fixture comprises cavities 408 abut to the PTH 406 allowing the insertion of the PTH pins 416. At a step 403, an amount as sufficient to fill over 70% of the space of the PTH 406, of a conductive ink 410 is deposited into the cavities 406 and cavities 408 to form a filled material 414. The deposition of the conductive ink 410 is able to be performed by using an aerosol jet printer 408. In some embodiments, a sheath gas 412 is able to be used to facilitate the delivery of the conductive ink 410. A person of ordinary skill in the art appreciates that other devices and methods are able to be used to deliver the conductive ink, such as an SMT dispenser. At step 405, component pins 416 are inserted into the PTH 406. Next, heat (such as 200° C.) is applied tp sinter the conductive ink 410 forming solid connections 418 between the PTH pins 416 and the barrels 420. Next, the fixture is removed.

Figure 5:
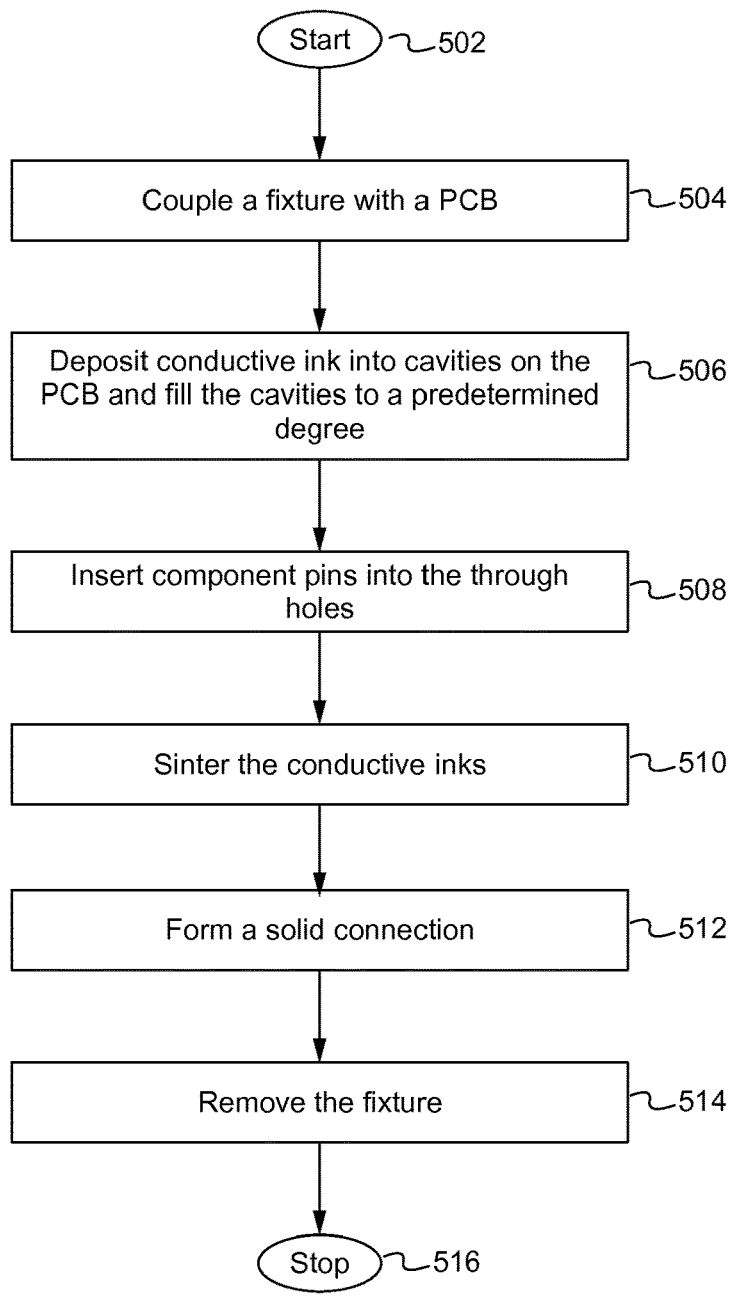
FIG. 5 is a flow chart illustrating a method of making a PTH assembly in accordance with some embodiments of the present invention.

FIG. 5 is a flow chart illustrating a method of making a PTH assembly 500 in accordance with some embodiments of the present invention. The method can start from step 502. At a step 504, a fixture is coupled with the PCB. At a step 506, a predetermined amount of a conductive ink is deposited into cavities on the PCB and fill the cavities to a predetermined degree, such as 99% of the over all space of the cavities. At a step 508, component pins are inserted into the plated through holes. At a step 510, the conductive inks are sintered. At a step 512, solid connections are formed. At a step 514, the fixture is removed. The process 500 can stop at a step 516.

To utilize, the methods and constructions disclosed are able to be used to fill any holes and cavities including components in the semiconductor industry that possess holes and/or need to make conductive connections or insulation plugs. The nanocopper ink is disclosed as an example. Other conductive materials are applicable. For example, any metals are within the scope of the present invention. Also any materials/molecules that are able to be dispersed or dissolved in a solvent (e.g., organic, inorganic, ionic solvents) are able to be used to fill cavities using the methods described above.

In operation, a filling material is dispersed and/or dissolved in a solvent. Next, the solution (with the filling material) is filled in the PTH. Next, the PTH filled with the solution is sintered, such that the solvent is evaporated forming a predetermined filling material.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. An apparatus comprising an aperture on an electronic board,
   wherein the aperture contains an amount of conductive copper nanoparticles dispersed in a solvent, wherein the aperture contains a plated area extending the entire depth of the aperture that is void of the conductive copper nanoparticles.

2. The apparatus of claim 1, wherein the aperture comprises a plated through hole.

3. The apparatus of claim 1, wherein the electronic board comprises a printed circuit board.

4. The apparatus of claim 1, wherein the conductive particles comprise a nano copper ink.

5. The apparatus of claim 1, further comprising a pin.

6. The apparatus of claim 5, wherein the pin blocks the bottom of the aperture forming a seal preventing the conductive particles from leaking out from the aperture.

7. The apparatus of claim 6, wherein a portion of the pin is inside the aperture and forms the void.

8. The apparatus of claim 1, wherein the area is centrally located within the aperture.

9. An apparatus comprising:
   an electronic board including:
      a through hole with a first end and a second end, the through hole having plated side walls; and
      a filling area formed by a barrel, wherein the filling area extends beyond the ends of the through hole; and
   an amount of conductive copper nanoparticles dispersed in a solvent that is in the through hole, wherein the solvent fills the entire through hole except for the plated side walls and covers an internal surface of the barrel and beyond both ends of the through hole.

10. The apparatus of claim 9, further comprising a pin located in the through hole, wherein a standoff stand of the pin blocks one of the ends of the through hole by coupling with a pad located at an edge of the one end.

11. The apparatus of claim 10, further comprising a package, wherein the standoff stand abuts a top surface of the package and is between the electronic board and the package.

12. The apparatus of claim 11, wherein the electronic board comprises a printed circuit board.

13. The apparatus of claim 12, wherein the conductive particles comprise a nano copper ink.

* * * * *